(12) United States Patent
Maekawa et al.

(10) Patent No.: US 10,819,099 B2
(45) Date of Patent: Oct. 27, 2020

(54) RELAY DEVICE

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Kosei Maekawa, Mie (JP); Hiromichi Yasunori, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 199 days.

(21) Appl. No.: 16/093,059

(22) PCT Filed: Mar. 28, 2017

(86) PCT No.: PCT/JP2017/012658
§ 371 (c)(1),
(2) Date: Oct. 11, 2018

(87) PCT Pub. No.: WO2017/179414
PCT Pub. Date: Oct. 19, 2017

(65) Prior Publication Data
US 2019/0123545 A1    Apr. 25, 2019

(30) Foreign Application Priority Data

Apr. 15, 2016 (JP) .................................. 2016-081873

(51) Int. Cl.
*H02H 3/24* (2006.01)
*G05F 1/10* (2006.01)
(Continued)

(52) U.S. Cl.
CPC ............... *H02H 3/24* (2013.01); *G05F 1/10* (2013.01); *H02H 7/18* (2013.01); *H02J 7/00* (2013.01); *H02J 7/14* (2013.01); *H02M 3/156* (2013.01)

(58) Field of Classification Search
CPC .......... B60L 3/0046; B60L 3/04; B60L 58/20; B60R 16/033; G05F 1/10; H02H 1/0007;
(Continued)

(56) References Cited

U.S. PATENT DOCUMENTS 6,329,772 B1 * 12/2001 Ochiai ..................... B60K 6/48
318/139
7,367,302 B2 * 5/2008 Bolz ....................... H02J 7/345
123/179.3

(Continued)

FOREIGN PATENT DOCUMENTS

JP    S60070928 A    4/1985
JP    2011229216 A    11/2011
(Continued)

OTHER PUBLICATIONS

International Search Report, Application No. PCT/JP2017/012658 dated Apr. 25, 2017.

*Primary Examiner* — Jared Fureman
*Assistant Examiner* — Nicolas Bellido
(74) *Attorney, Agent, or Firm* — Honigman LLP

(57) ABSTRACT

Provided is a relay device that can switch conduction of a current flow path between power storage units on and off, and can suppress a decrease in the output of the power storage units if an abnormality occurs. A relay device includes: a conductive path; a switch unit switched between an ON state, and an OFF state; a coil connected in series to the switch unit; a first voltage detection unit configured to detect a voltage of the conductive path at a position on a first power storage unit side; a second voltage detection unit
(Continued)

configured to detect a voltage of the conductive path at a position on a second power storage unit side; and a control unit configured to switch the switch unit to the OFF state if a value detected by the first voltage detection unit and/or the second voltage detection unit indicates a predetermined abnormal value.

7 Claims, 3 Drawing Sheets

(51) Int. Cl.
*H02H 7/18* (2006.01)
*H02J 7/14* (2006.01)
*H02M 3/156* (2006.01)
*H02J 7/00* (2006.01)

(58) Field of Classification Search
CPC ............ H02H 3/021; H02H 3/08; H02H 3/16; H02H 3/24; H02H 7/008; H02H 7/16; H02H 7/18; H02H 9/02; H02J 1/06; H02J 2310/46; H02J 2310/48; H02J 7/00; H02J 7/0031; H02J 7/14; H02J 7/1423; H02J 7/345; H02M 3/156; H03K 17/08142; H03K 17/122; H03K 17/162; H03K 2217/0009
See application file for complete search history.

(56) References Cited

U.S. PATENT DOCUMENTS

| | | | |
|---|---|---|---|
| 9,650,000 B2 * | 5/2017 | Decoster | B60R 16/03 |
| 10,399,518 B2 * | 9/2019 | Maekawa | H02J 7/0021 |
| 10,677,851 B2 * | 6/2020 | Yasunori | B60R 16/033 |
| 2005/0035656 A1 | 2/2005 | Kuramochi et al. | |
| 2009/0206679 A1 * | 8/2009 | King | B60L 58/22 307/125 |
| 2011/0260544 A1 * | 10/2011 | Imai | H02J 7/1423 307/66 |
| 2013/0234504 A1 * | 9/2013 | Morita | B60R 16/03 307/9.1 |
| 2013/0320986 A1 | 12/2013 | Shiraishi et al. | |
| 2014/0239637 A1 * | 8/2014 | Sink | H02J 7/34 290/31 |
| 2017/0080883 A1 * | 3/2017 | Yasunori | B60L 58/21 |
| 2017/0166145 A1 * | 6/2017 | Kinoshita | F02P 7/077 |
| 2018/0162300 A1 * | 6/2018 | Yasunori | B60R 16/03 |
| 2018/0272968 A1 * | 9/2018 | Yasunori | H02J 7/1423 |
| 2019/0115176 A1 * | 4/2019 | Yasunori | H02J 7/00 |
| 2019/0123547 A1 * | 4/2019 | Yasunori | H02H 1/0007 |
| 2019/0237988 A1 * | 8/2019 | Maekawa | H01M 10/48 |
| 2020/0156571 A1 * | 5/2020 | Yasunori | H02H 7/18 |

FOREIGN PATENT DOCUMENTS

| | | |
|---|---|---|
| JP | 2012130108 A | 7/2012 |
| JP | 2015076959 A | 4/2015 |
| WO | 2013115034 A1 | 8/2013 |

* cited by examiner

RELAY DEVICE

CROSS-REFERENCE TO RELATED APPLICATIONS

This application is the U.S. national stage of PCT/JP2017/012658 filed Mar. 28, 2017, which claims priority of Japanese Patent Application No. JP 2016-081873 filed Apr. 15, 2016.

TECHNICAL FIELD

The present disclosure relates to a relay device that is configured as a peripheral device of power storage units.

BACKGROUND

JP 2012-130108A discloses an example of an on-board power supply device. The power supply device disclosed in JP 2012-130108A includes a lead storage battery and a lithium storage battery, and is provided with an electrical supply line serving as a power path between the lead storage battery and the lithium storage battery. Two MOSFETs are also provided that switch conduction of the electrical supply line on and off. The power supply device performs control such that the MOSFETs are switched on and off based on the state of charge (SOC) of the lithium storage battery during, for example, non-regeneration (such as idling, acceleration, or steady traveling) so that the SOC is within an optimum range.

According to the technique of JP 2012-130108A, if, for example, an earth fault occurs in the electrical supply line connected between the lead storage battery and the lithium storage battery, a high current will instantaneously flow through the electrical supply line. Accordingly, the voltages output from the lead storage battery and the lithium storage battery decrease instantaneously upon the occurrence of the earth fault, and the output voltages are thus in a significantly low state up until the two MOSFETs are switched off to interrupt the high current. Such a significant decrease in the output of the storage batteries due to a high current may cause a problem such as a load becoming inoperative.

The present disclosure was made in view of the aforementioned circumstances, and it is an object thereof to provide a relay device that can switch conduction of a current flow path between power storage units on/off, and can suppress a reduction in the output of the power storage units if an abnormality such as an earth fault occurs, thereby realizing a protection operation.

SUMMARY

According to the present disclosure, a relay device includes a conductive path between a first wiring electrically connected to a first load and a first power storage unit, and a second wiring electrically connected to a second load and a second power storage unit. The conductive path serves as a path through which a current flows. A switch unit is connected to the conductive path between the first wiring and the second wiring, and is configured to be switched between an ON state in which a current can flow through the conductive path, and an OFF state in which the conductive path is in a predetermined no current flow state. An inductance unit is connected in series to the switch unit between the first wiring and the second wiring, and has an inductance component. A first voltage detection unit is configured to detect a voltage of the conductive path at a position on the first power storage unit side with respect to the inductance unit. A second voltage detection unit configured to detect a voltage of the conductive path at a position on the second power storage unit side with respect to the inductance unit. A control unit is configured to switch the switch unit to the OFF state if a value detected by at least one of the first voltage detection unit and the second voltage detection unit has decreased to a predetermined abnormal value.

Advantageous Effects

According to the present disclosure, if an earth fault or the like has occurred in a current flow path (conductive path) between the first power storage unit and the second power storage unit or a portion electrically connected to this conductive path, and the voltage in the conductive path is abnormal, protection can be achieved by switching the switch unit to the OFF state. Furthermore, the inductance unit is connected in series to the switch unit, and thus, when a current flows from any one of the power storage units toward the position at which the earth fault occurred via the inductance unit and the switch unit, the rate of increase in this current can be suppressed. Accordingly, a decrease in the voltage of the corresponding power storage unit can be suppressed up until the off operation (protection operation) on the conductive path performed by the switch unit is complete, so that a problem caused by a decrease in the output of that power storage unit is unlikely to occur.

Moreover, the voltage detection units (the first voltage detection unit and the second voltage detection unit) are respectively provided at positions, in the path, on the first power storage unit side and the second power storage unit side with respect to the inductance unit, and thus, if an earth fault or the like has occurred in the conductive path or a portion electrically connected to the conductive path, the value detected by any one of the voltage detection units will immediately change to an abnormal value due to the occurrence of the earth fault or the like. For example, if an earth fault or the like has occurred, on the first power storage unit side, of the conductive path or a portion electrically connected to the conductive path, the voltage on the first power storage unit side of the conductive path instantaneously decreases, and thus the value detected by the first voltage detection unit instantaneously changes to an abnormal value. Similarly, if an earth fault or the like has occurred, on the second power storage unit side, of the conductive path or a portion electrically connected to the conductive path, the voltage on the second power storage unit side of the conductive path instantaneously decreases, and thus the value detected by the second voltage detection unit instantaneously changes to an abnormal value. Accordingly, the control unit can promptly recognize the abnormal state (state in which the detected voltage value has changed to an abnormal value) in the event of an earth fault, and can switch the switch unit to the OFF state in earlier stage.

In this way, if an earth fault or the like has occurred, a sudden increase in current can be suppressed by the inductance unit, and the switch units can promptly undergo an off operation by the control unit, making it possible to suppress a current that flows through the conductive path during the time period from the occurrence of the earth fault up until the switch unit is switched to the OFF state to a smaller current, and suppress a reduction in the voltage of the power storage unit provided on the side opposite to that on which the earth fault or the like occurred to a smaller voltage.

DETAILED DESCRIPTION OF PREFERRED EMBODIMENTS

Figure 1:
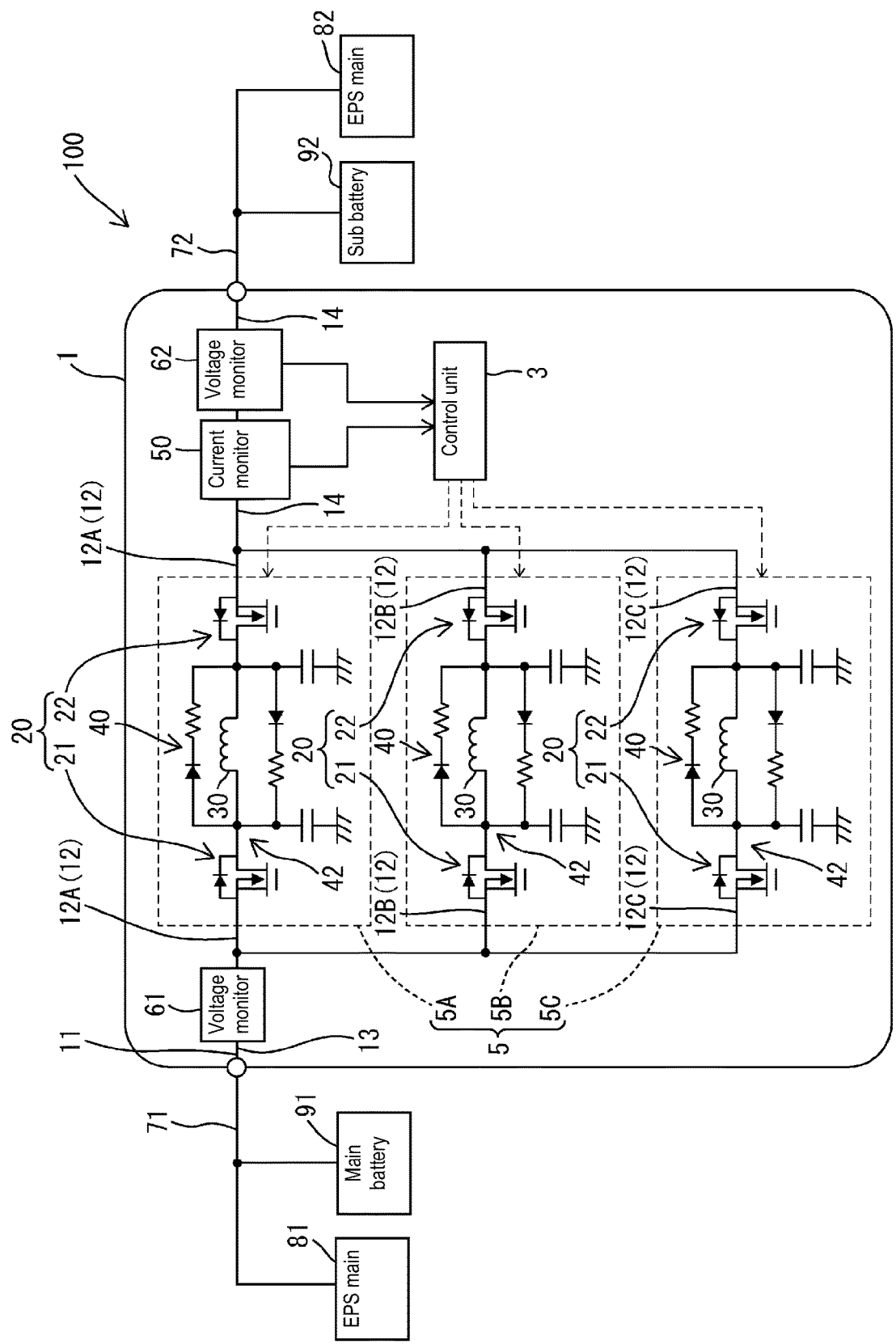
FIG. 1 is a circuit diagram schematically illustrating an example of an on-board power supply system provided with a relay device according to Embodiment 1.

In the present disclosure, the switch unit may include: a first semiconductor switch provided with a first element unit that is switched between an ON state and an OFF state, and a first diode unit connected in parallel to the first element unit; and a second semiconductor switch provided with a second element unit that is switched between an ON state and an OFF state, and a second diode unit that is connected in parallel to the second element unit and is arranged inversely with respect to the first diode unit.

According to this configuration, it is possible to interrupt a bi-directional current flow on the conductive path. If an earth fault or the like has occurred at a position, on the second power storage unit side, of the conductive path or the portion electrically connected to this conductive path, the rate of increase in the discharge current that is to flow from the first power storage unit toward the position at which the earth fault occurred is diminished by the inductance unit, and thus a sudden decrease in the voltage of the first power storage unit can be suppressed. In this case, a decrease in the voltage of the first power storage unit can be suppressed up until the off operation (protection operation) on the conductive path performed by the switch unit is complete, so that a problem caused by a decrease in the output of the first power storage unit is unlikely to occur. Alternatively, if an earth fault or the like has occurred at a position, on the first power storage unit side, of the conductive path or a portion electrically connected to this conductive path, the rate of increase in the discharge current that is to flow from the second power storage unit toward the position at which the earth fault occurred is diminished by the inductance unit, and thus a sudden decrease in the voltage of the second power storage unit is suppressed. In this case, a decrease in the voltage of the second power storage unit can be suppressed up until the off operation (protection operation) on the conductive path performed by the switch unit is complete, so that a problem caused by a decrease in the output of the second power storage unit is unlikely to occur.

In the present disclosure, a protective circuit unit may be provided that is configured to suppress a back electromotive force that is generated in the inductance unit when the switch unit is switched off in a state in which a current is flowing through the conductive path in a first direction from any one of the first power storage unit and the second power storage unit to the other one, and to suppress a back electromotive force that is generated in the inductance unit when the switch unit is switched off in a state in which a current is flowing through the conductive path in a second direction, which is the reverse direction of the first direction.

According to this configuration, it is possible to realize a configuration that diminishes, using the inductance unit, the rate of increase in the discharge current that flows from a power storage unit in the event of an earth fault or the like, while suppressing, using the protective circuit unit, a back electromotive force that is generated in the inductance unit when the switch unit is switched off. Accordingly, it is possible to avoid problems (such as breakage of the switch unit) caused by the back electromotive force. Particularly, it is possible to interrupt a current flowing through the conductive path in either of the first direction or the second direction, and to suppress a back electromotive force that is generated when a current flowing in either direction is interrupted, making it possible to more reliably avoid problems (such as breakage of the switch unit) caused by the back electromotive force.

In the present disclosure, a plurality of series configuration units, in each of which the switch unit and the inductance unit are connected in series to each other, may be connected in parallel to each other between the first power storage unit and the second power storage unit.

According to this configuration, it is possible to realize a configuration in which a higher current can flow between the first power storage unit and the second power storage unit, with a downsized switch unit and a downsized inductance unit.

Embodiment 1

Hereinafter, Embodiment 1, which is an embodiment of the present disclosure, will be described.

An on-board power supply system 100 shown in FIG. 1 is configured as an on-board power supply system provided with a plurality of electric power supplies (a first power storage unit 91 and a second power storage unit 92). A relay device 1 constitutes part of the on-board power supply system 100 and has a function of switching a path between the first power storage unit 91 (main battery) and a second power storage unit 92 (sub battery) between a current flow state and a no current flow state.

The following will describe, as a representative example of the on-board power supply system 100, a configuration that includes a main load 81, which serves as a first load, and a sub load 82, which serves as a second load, the main load 81 and the sub load 82 having the same function. Note however that this configuration is merely a representative example, and the application of the relay device 1 is not limited to this configuration.

The main load 81 is, for example, a motorized power steering system, and is configured to be supplied with electric power from the first power storage unit 91 so that an electric component such as a motor can operate. The sub load 82 is a motorized power steering system that has the same configuration and function as those of the main load 81. The on-board power supply system 100 is configured as a system in which, if the main load 81 malfunctions, the sub load 82 operates in place of the main load 81 so that the function of the main load 81 can be maintained even if the main load 81 malfunctions.

The first power storage unit 91 is a power supply unit that can supply electric power to the main load 81, and is made of a well-known power source such as a lead battery, for example. The second power storage unit 92 is a power supply unit that can supply electric power to the sub load 82, and is made of a well-known power source such as a lithium-ion battery or an electric double layer capacitor, for example.

The first power storage unit 91 and the main load 81 are connected to a wiring 71 provided outside of the relay device 1, the wiring 71 being connected to a not-shown electric generator. The second power storage unit 92 and the sub load 82 are connected to a wiring 72 provided outside of the relay device 1. The wiring 71 is connected to a common conductive path 13 included in a later-described conductive path 11, and the wiring 72 is connected to a common conductive path 14 included in the later-described conductive path 11. The first power storage unit 91 is charged with electric power generated by the electric generator. If a separate relay 5 is in an ON state (in which an electric current can flow), the second power storage unit 92 is charged with electric power generated by the electric generator or electric power from the first power storage unit 91.

The relay device 1 is provided with the conductive path 11, a plurality of separate relays 5 (separate relays 5A, 5B, and 5C), a current detection unit 50, a first voltage detection unit 61, a second voltage detection unit 62, and a control unit 3.

The conductive path 11 is a portion serving as a current flow path between the first power storage unit 91 and the second power storage unit 92. The conductive path 11 includes the common conductive path 13 on the first power storage unit 91 side, the common conductive path 14 on the second power storage unit 92 side, and a plurality of parallel conductive paths 12 (individual conductive paths) connected between the common conductive paths 13 and 14. The conductive path 11 is a power line, and serves as a current flow path through which an electric current from the first power storage unit 91 or the not-shown electric generator flows to the second power storage unit 92. Furthermore, in some cases, the conductive path 11 may also serve as a path through which a current discharged from the second power storage unit 92 flows to the wiring 71 side. The common conductive path 13 is connected to the wiring 71 on the first power storage unit 91 side, and is electrically connected to the first power storage unit 91 via the wiring 71. The common conductive path 14 is connected to the wiring 72 on the second power storage unit 92 side, and is electrically connected to the second power storage unit 92 via the wiring 72. The parallel conductive paths 12 are current flow paths connected in parallel to each other between the common conductive paths 13 and 14, and serve as portions at which a current flowing through the conductive path 11 is branched.

Figure 2:
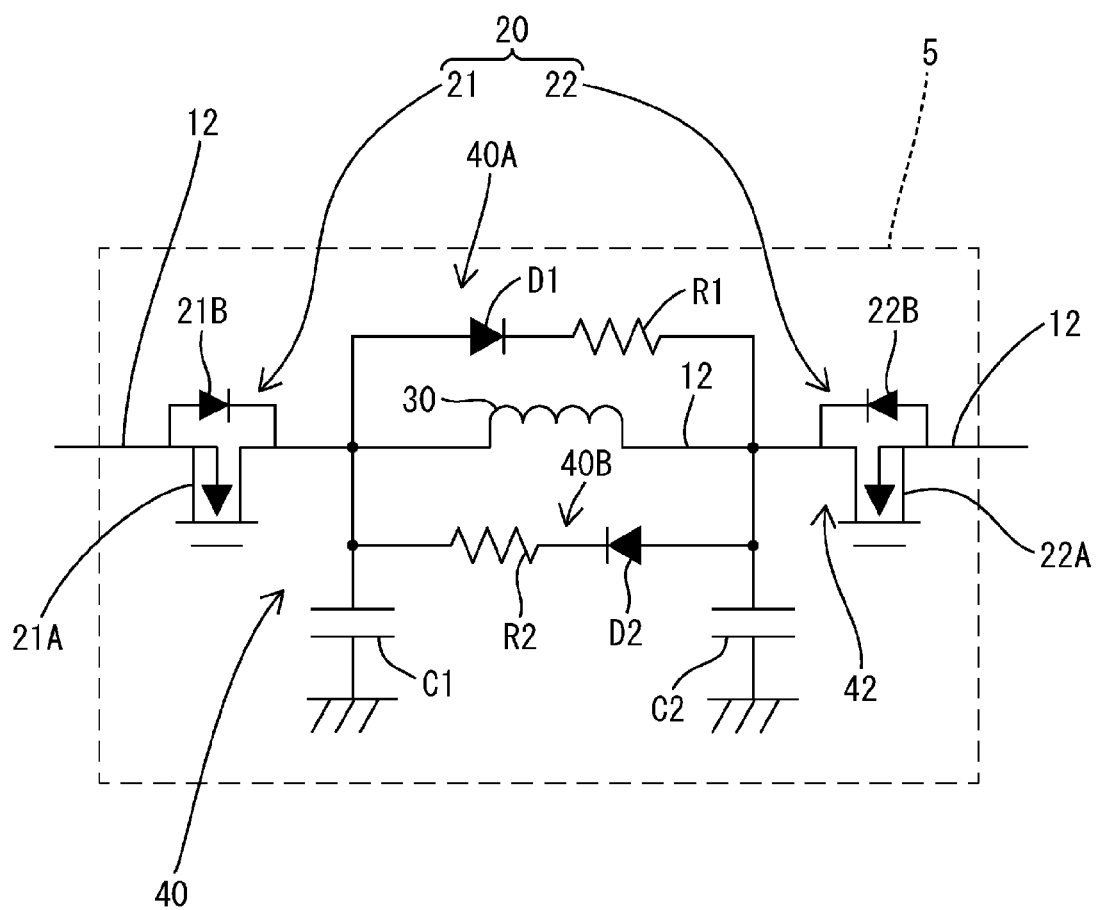
FIG. 2 is a circuit diagram illustrating a separate relay that constitutes part of the relay device according to Embodiment 1.

The three separate relays 5 are connected in parallel to each other between the common conductive path 13 and the common conductive path 14, and each of the separate relays 5 is constituted by one of the above-described parallel conductive paths 12 and a plurality of associated electronic components. Each of the three separate relays 5 has a function of causing, when in the ON state, a current to flow between the common conductive path 13 and the common conductive path 14, and interrupting, when in the OFF state, the current flow between the common conductive path 13 and the common conductive path 14. In FIG. 1, of the three separate relays 5, the first separate relay is denoted by the reference numeral 5A, the second separate relay is denoted by the reference numeral 5B, and the third separate relay is denoted by the reference numeral 5C. These three separate relays 5 have the same circuit configuration, and FIG. 2 shows a common circuit configuration of the three separate relays 5. Furthermore, in FIG. 1, of the parallel conductive paths 12 provided in parallel to each other, the parallel conductive path 12 that constitutes part of the first separate relay 5A is denoted by the reference numeral 12A, the parallel conductive path 12 that constitutes part of the second separate relay 5B is denoted by the reference numeral 12B, and the parallel conductive path 12 that constitutes part of the third separate relay 5C is denoted by the reference numeral 12C.

As shown by FIG. 2, the separate relays 5 each have a series configuration unit 42, in which a switch unit 20 and a coil 30 (inductance unit) are connected in series to each other, and a protective circuit unit 40 that exerts a protective effect when the switch unit 20 is switched off. The series configuration unit 42 is a portion that includes two N-channel type MOSFETs 21 and 22, and the coil 30 (inductance unit) arranged between these two MOSFETs 21 and 22, and has a configuration in which the two MOSFETs 21 and 22 are connected in series to the coil 30. As shown in FIG. 1, the relay device 1 has a configuration in which a plurality of series configuration units 42, in each of which a switch unit 20 (two MOSFETs 21 and 22) and a coil 30 are connected in series to each other, are connected in parallel to each other between the first power storage unit 91 and the second power storage unit 92, and constitute branched paths.

In the relay device 1 shown in FIG. 1, two MOSFETs 21 and 22 that are provided in each of the plurality of separate relays 5 constitute a switch unit 20. Specifically, when all of the switch units 20 are in the OFF state, that is, all of the pairs of two MOSFETs 21 and 22 provided in the plurality of separate relays 5 are in the OFF state, the current flowing through the conductive path 11 is interrupted. In this way, the state in which all of the pairs of two MOSFETs 21 and 22 are undergoing an off operation corresponds to the "OFF state" in which the conductive path 11 is in a predetermined no current flow state, and in this state, conduction between the wiring 71 and the wiring 72 is interrupted. Alternatively, the state in which at least one of the pairs of MOSFETs 21 and 22 is undergoing an on operation, that is, at least one of the separate relays 5 is undergoing an on operation corresponds to the "ON state" in which a current can flow through the conductive path 11, that is, the path between the wiring 71 and the wiring 72 is conductive.

As shown in FIG. 2, the MOSFET 21 is provided with a first element unit 21A that is switched between an ON state and an OFF state, and a body diode 21B (parasitic diode) connected in parallel to the first element unit 21A. Specifically, the portion of the MOSFET 21 excluding the body diode 21B corresponds to the first element unit 21A. The "ON state" of the first element unit 21A refers to the state in which a current can flow between the drain and the source of the MOSFET 21 via a channel, and the "OFF state" of the first element unit 21A refers to a state in which no current can flow via the channel. The body diode 21B corresponds to an example of a first diode unit. The MOSFET 22 is provided with a second element unit 22A that is switched between an ON state and an OFF state, and a body diode 22B (parasitic diode) connected in parallel to the second element unit 22A. Specifically, the portion of the MOSFET 22 excluding the body diode 22B corresponds to the second element unit 22A. The "ON state" of the second element unit 22A refers to a state in which a current can flow between the drain and the source of the MOSFET 22 via a channel, and the "OFF state" of the second element unit 22A refers to the state in which no current can flow via the channel. The body diode 22B corresponds to an example of a second diode unit.

The coil 30 corresponds to an example of an inductance unit that has an inductance component. The coil 30 (inductance unit) is connected between the MOSFET 21 and the MOSFET 22, the coil 30 being connected in series to these MOSFETs 21 and 22. The effects and functions of the coil 30 will be described later.

The protective circuit unit 40 shown in FIG. 2 is configured as a circuit for suppressing a back electromotive force that is generated in the coil 30 (inductance unit) when the switch unit 20 is switched off. The protective circuit unit 40 includes resistance units R1 and R2, diodes D1 and D2, and capacitors C1 and C2, and is configured as a snubber circuit. Specifically, a first circuit unit 40A, in which the diode D1 and the resistance unit R1 are connected in series to each other, and a second circuit unit 40B, in which the diode D2 and the resistance unit R2 are connected in series to each other, are connected in parallel to the coil 30. The capacitor C1 is connected between one end of the coil 30 and the ground, and the capacitor C2 is connected between the other end of the coil 30 and the ground. In the first circuit unit 40A, the anode of the diode D1 is connected to one end of the coil, and in the second circuit unit 40B, the anode of the diode D2 is connected to the other end of the coil.

In the separate relay 5 shown in FIG. 2, in a state in which both of the MOSFETs 21 and 22 are kept in the ON state and a current is flowing through the parallel conductive path 12 in a direction from the first power storage unit 91 side to the second power storage unit 92 side (first direction), if both of the MOSFETs 21 and 22 are switched off, a back electromotive force will be generated in the coil 30 (inductance unit). At this time, it is possible to suppress the back electromotive force by subjecting the current of the coil 30 to reflux in the second circuit unit 40B. Conversely, if both of the MOSFETs 21 and 22 are switched off in a state in which a current is flowing through the parallel conductive path 12 in a direction from the second power storage unit 92 side toward the first power storage unit 91 side (second direction), a back electromotive force will be generated in the coil 30 (inductance unit). At this time, it is possible to suppress the back electromotive force by subjecting the current of the coil 30 to reflux in the first circuit unit 40A.

The current detection unit 50 shown in FIG. 1 is configured as a well-known current detection circuit (current monitor). This current detection unit 50 is configured to output the value of a current flowing through the common conductive path 14 as a detected value, and the current value detected by the current detection unit 50 is to be input to the control unit 3.

The first voltage detection unit 61 is configured as a well-known voltage detection circuit (voltage monitor), and is configured to detect the voltage of the conductive path 11 at a position on the first power storage unit 91 side with respect to all of the MOSFETs 21. Specifically, the first voltage detection unit 61 is configured to output the value of a voltage of the common conductive path 13 as a detected value, and the voltage value detected by the first voltage detection unit 61 is to be input to the control unit 3 via a not-shown signal line.

The second voltage detection unit 62 is configured as a well-known voltage detection circuit (voltage monitor), and is configured to detect the voltage of the conductive path 11 at a position on the second power storage unit 92 side with respect to all of the MOSFETs 22. Specifically, the second voltage detection unit 62 is configured to output the value of a voltage of the common conductive path 14 as a detected value, and the voltage value detected by the second voltage detection unit 62 is to be input to the control unit 3 via a signal line.

The control unit 3 is, for example, a microcomputer provided with a CPU, a ROM, a RAM, and an A/D converter. The value detected by the current detection unit 50 (value of a current flowing through the common conductive path 14), the value detected by the first voltage detection unit 61 (voltage value of the common conductive path 13), and the value detected by the second voltage detection unit 62 (voltage value of the common conductive path 14) are input to the control unit 3. The detected values input to the control unit 3 are converted into digital values by the A/D converter included in the control unit 3. The control unit 3 has a function of controlling switching-on/off of the switch units 20 (MOSFETs 21 and 22) of the separate relays 5, that is, the control unit 3 functions to switch off all of the switch units 20 of the separate relays 5 if a value detected by at least one of the first voltage detection unit 61 and the second voltage detection unit 62 indicates a predetermined abnormal value, to interrupt the current flowing through the conductive path 11, for example.

Here, a basic operation of the relay device 1 in a normal state will be described.

In the relay device 1, the control unit 3 controls switching-on/off of the switch units 20 (specifically, the pairs of MOSFETs 21 and 22 provided in the separate relays 5). If a predetermined ON condition is met, the control unit 3 performs control to switch on all of the pairs of MOSFETs 21 and 22 provided in all of the separate relays 5. When the MOSFETs 21 and 22 are switched on in this way, the path between the first power storage unit 91 and the second power storage unit 92 is conductive. The timing at which the control unit 3 performs control to switch on the plurality of switch units 20 is not particularly limited. For example, the control unit 3 may also be configured to continuously monitor the voltage output from the second power storage unit 92, and perform control to switch on all of the switch units 20 (MOSFETs 21 and 22) included in all of the separate relays 5 if the voltage output from the second power storage unit 92 has decreased to a value lower than a predetermined voltage threshold. In other words, the control unit 3 may perform control to switch the conductive path 11 to the conductive state if the voltage output from the second power storage unit 92 has decreased, so that the second power storage unit 92 is charged with the electric power from the electric generator or the first power storage unit 91. Of course, the switch units 20 may also be switched on at another timing.

Furthermore, if a predetermined OFF condition is met, the control unit 3 performs control to switch off all of the pairs of MOSFETS 21 and 22 included in the separate relays 5. The number of conditions under which the control unit 3 performs control to switch off all of the switch units 20 is not limited to one. For example, the control unit 3 may also be configured to perform control to switch off all of the switch units 20 (MOSFETs 21 and 22) included in all of the separate relays 5 if the output voltage of the second power storage unit 92 is equal to or greater than the predetermined voltage threshold (that is, if the second power storage unit 92 is sufficiently charged). Of course, the switch units 20 may also be switched off at another timing.

The following will describe an operation of the relay device 1 in an abnormal state.

If a predetermined abnormal state has occurred, the control unit 3 performs control to forcibly switch off all of the switch units 20 (MOSFETs 21 and 22) included in all of the separate relays 5. Specifically, the control unit 3 continuously monitors detected values (voltage values) input from the first voltage detection unit 61 and the second voltage detection unit 62, and performs control to switch off all of the pairs of MOSFETs 21 and 22 included in the separate relays 5 if a detected value input from at least one of the first voltage detection unit 61 and the second voltage detection unit 62 is equal to or smaller than a predetermined abnormality threshold Vth. Note that the value of the abnormality threshold Vth is not particularly limited as long as it is smaller than a voltage output from the fully charged first power storage unit 91 and second power storage unit 92, and can be set to, for example, a value that is significantly lower than the above-described predetermined voltage threshold.

For example, if all of the pairs of MOSFETs 21 and 22 included in the separate relays 5 are in the ON state, the voltage value of the common conductive path 14 that is detected by the second voltage detection unit 62 indicates the output voltage of the second power storage unit 92 (sub battery). If, in this state, an earth fault occurs in the wiring 72 connected to the second power storage unit 92 (sub battery), the voltage value of the wiring 72 and the common conductive path 14 will change to a value close to 0V (ground potential), and the voltage value that is detected by the second voltage detection unit 62 will instantaneously decrease to a value close to 0V. In other words, the voltage value that is detected by the second voltage detection unit 62 immediately after the occurrence of the earth fault instantaneously decreases to a value smaller than the abnormality threshold Vth, and thus, immediately after the occurrence of the earth fault, the control unit 3 instantaneously determines that there is an abnormality. Also, the control unit 3 instantaneously performs control to switch off all of the pairs of MOSFETs 21 and 22 included in all of the separate relays 5, to interrupt the current flowing through the conductive path 11.

Furthermore, the relay device 1 is provided with coils 30 that are respectively provided on the parallel conductive paths 12 (electric power lines) of the plurality of separate relays 5, and has a configuration in which the inductance components of these coils 30 suppress an instantaneous increase in current upon occurrence of an earth fault, and thus no high current occurs instantaneously in the event of an earth fault as described above. With this configuration, the amount of current flowing through the conductive path 11 can be suppressed significantly during the period from the occurrence of an earth fault up until the current flowing through the conductive path 11 is interrupted (up until all of the MOSFETs 21 and 22 included in all of the separate relays 5 are switched off by the control unit 3).

Figure 3A:
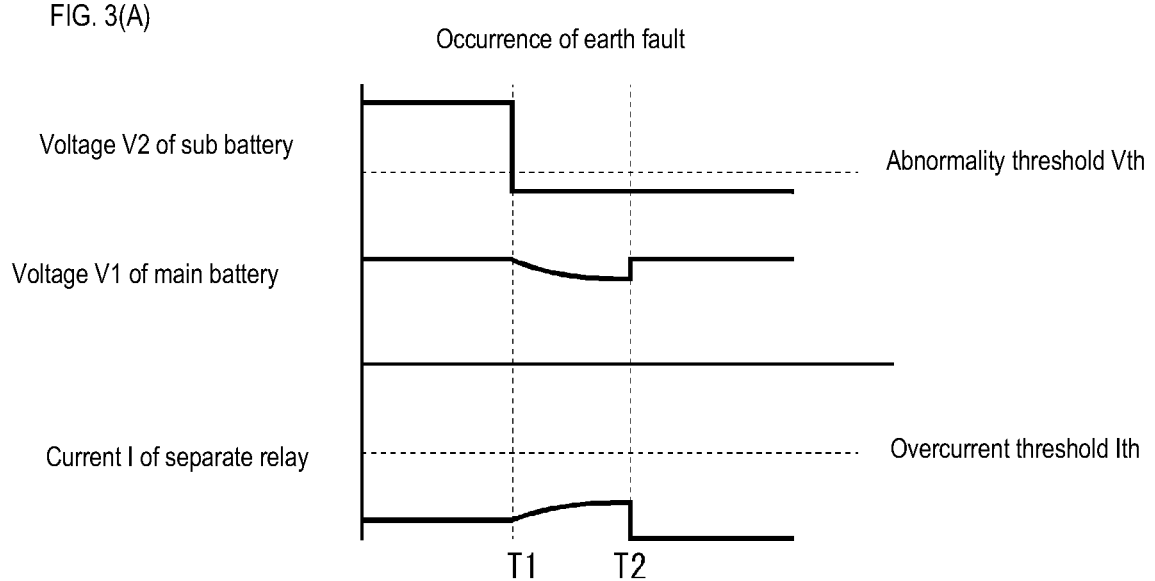
FIG. 3(A) is a timing diagram illustrating examples of changes in the voltage of a sub battery, voltage of a main battery (first power storage unit), and in the current of the separate relay before and after an earth fault that occurred on a sub battery (second power storage unit) side of the relay device of Embodiment 1.

FIG. 3(A) shows a relationship between a voltage V2 of the second power storage unit 92 (sub battery), a voltage V1 of the first power storage unit 91 (main battery), and a current I flowing from the wiring 71 to the wiring 72 via the conductive path 11 (current flowing through the plurality of separate relays 5) when an earth fault has occurred in the wiring 72 connected to the second power storage unit 92 (sub battery). FIG. 3(A) shows a case where an earth fault has occurred in the wiring 72 on the second power storage unit 92 (sub battery) side at the time T1 in a state in which all of the switch units 20 have been switched to the ON state prior to an earth fault occurrence time T1. In this case, immediately after the earth fault occurrence time T1, the voltage of the wiring 72 and the common conductive path 14 (that is, the voltage V2 of the second power storage unit 92 (sub battery)) instantaneously decreases to a value smaller than the abnormality threshold Vth, and thus the control unit 3 instantaneously performs control to switch off all of the switch units 20, and at a time T2 at which the switching control is complete, all of the switch units 20 are switched off. In other words, in the present configuration, immediately after the earth fault occurrence time T1, the control unit 3 instantaneously determines that there is an abnormality, and instantaneously performs control to switch off all of the switch units 20, and thus it is possible to reduce the length of time between the earth fault occurrence time T1 and the time T2 at which the switching is complete. For example, in the circuit shown in FIG. 1, as a control method serving as a comparative example, it is also conceivable to control all of the switch units 20 to undergo an off operation when the current value detected by the current detection unit 50 (current value of a current flowing through the common conductive path 14) has reached a predetermined overcurrent threshold Ith (see FIG. 3(A)). However, in this control method of the comparative example, it is inevitable that, after the earth fault occurrence time T1 shown in FIG. 3(A), a certain amount of time elapses until the current I of the separate relays 5 reaches the overcurrent threshold Ith, and after the time has elapsed, an OFF instruction to switch off all of the switch units 20 is given and switching of the switch units 20 is performed. In other words, the completion of interruption of the switch units 20 will be delayed by the time taken until the current I of the separate relays 5 reaches the overcurrent threshold Ith. In contrast, in the above-described control method of the present configuration, it is possible to detect a reduction in the voltage of the second power storage unit 92 (sub battery) that occurs at a point in time immediately after the earth fault occurrence time T1 (a point in time that is earlier than when the current I of the separate relays 5 reaches the overcurrent threshold Ith in the above-described comparative example), and perform control to promptly switch off the switch units 20, thus making it possible to interrupt the switch units 20 more quickly than in the control method of the comparative example, in which the interruption operation of the switch units 20 is performed only based on the current I of the separate relays 5.

In the example shown in FIG. 3(A), during the time period from the earth fault occurrence time T1 to the time T2 at which all of the switch units 20 are completely switched off, a current flows from the first power storage unit 91 (main battery) side toward the position in the wiring 72 at which the earth fault occurred, and thus the current I flowing through the plurality of separate relays 5 (current flowing through the conductive path 11) increases during this time period. However, the coils 30 respectively provided in the parallel conductive paths 12 suppress an instantaneous and sudden increase in the current flowing through the parallel conductive paths 12, and thus the current I flowing through the plurality of separate relays 5 (current I flowing through the conductive path 11) increases gradually. Also, the voltage of the first power storage unit 91 (main battery) decreases gradually instead of suddenly during the time period between the earth fault occurrence time T1 and the time T2 at which the off operation of all of the switch units 20 is complete. In other words, it is possible to suppress a sudden decrease in the voltage of the first power storage unit 91 (main battery) immediately after the occurrence of an earth fault, and to avoid such a situation in which the voltage of the first power storage unit 91 (main battery) is drastically reduced before all of the switch units 20 are switched off. Moreover, since the time interval between the time T1 and the time T2 can be reduced as described above, it is possible to further suppress a decrease in the voltage of the first power storage unit 91 (main battery) immediately after the occurrence of an earth fault, and solve a problem (such as ECU reset) that may be caused by a drastic reduction in the voltage of the first power storage unit 91 (main battery).

Figure 3B:
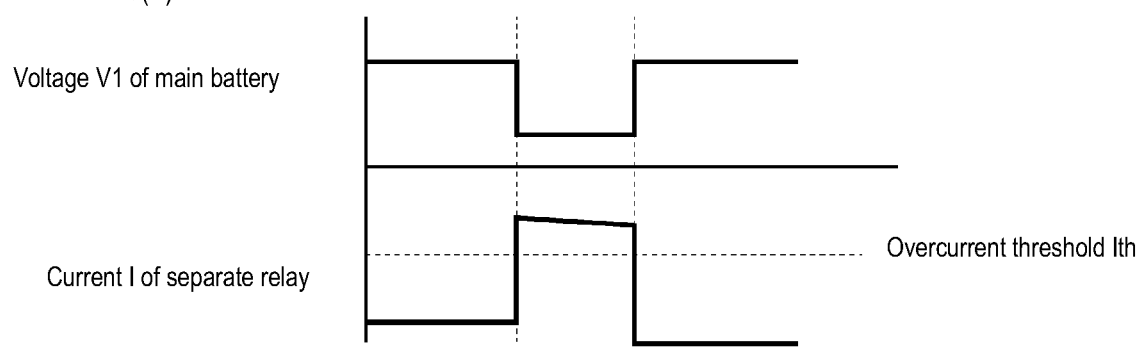
FIG. 3(B) is a timing diagram of a comparative example.

Note that FIG. 3(B) shows a relationship between the voltage V1 of the first power storage unit 91 (main battery)

and the current I flowing from the wiring 71 to the wiring 72 via the conductive path 11, when a earth fault similar to in FIG. 3(A) has occurred in a configuration in which the coils 30, the protective circuit units 40, the first voltage detection unit 61, and the second voltage detection unit 62 are omitted from the relay device 1 shown in FIG. 1, and the MOSFETs 21 and 22 are simply directly connected to each other. Note that, in the configuration of FIG. 3(B), it is assumed that the control unit 3 controls the switch units 20 to undergo an off operation upon an overcurrent state occurring in which the current of the conductive path 11 exceeds the overcurrent threshold Ith.

As shown in FIG. 3(B), in the configuration in which no coil 30 is provided, if an earth fault has occurred in the wiring 72, the amount of current increases instantaneously and suddenly from the point in time at which the earth fault has occurred, and the voltage V1 of the first power storage unit 91 (main battery) decreases instantaneously and suddenly. In this configuration, the voltage of the first power storage unit 91 significantly decreases during the time period from the detection of an overcurrent by the control unit 3 up until all of the switch units are completely switched off, and thus there is the risk of a problem such as an ECU reset or a reduction in power of an actuator. Such a problem should be avoided particularly for advanced driving function cars (such as automated cars). In contrast, the relay device 1 of the present configuration achieves a relationship as shown in FIG. 3(A), and thus such a problem can be solved.

Such effects are also achieved in a case where an earth fault has occurred on the first power storage unit 91 (main battery) side. For example, if an earth fault has occurred in the wiring 71 connected to the first power storage unit 91 (main battery) in a state in which all of the pairs of MOSFETs 21 and 22 included in the separate relays 5 are in the ON state, the voltage value of the wiring 71 and the common conductive path 13 will change to a value close to 0V (ground potential), and the voltage value detected by the first voltage detection unit 61 will instantaneously decrease to a value close to 0V. In other words, the voltage value that is detected by the first voltage detection unit 61 immediately after the occurrence of the earth fault instantaneously changes to a value smaller than the abnormality threshold Vth, and thus, immediately after the occurrence of the earth fault, the control unit 3 instantaneously determines that there is an abnormality. Then, the control unit 3 instantaneously performs control to switch off all of the pairs of MOSFETs 21 and 22 included in all of the separate relays 5, to interrupt the current flowing through the conductive path 11.

In this way, if an earth fault has occurred on the first power storage unit 91 (main battery) side, a current will flow from the second power storage unit 92 (sub battery) side toward the position in the wiring 71 at which the earth fault occurred during the time period from the occurrence of the earth fault up until the off operation of all of the switch units 20 is complete, and thus the current I flowing through the plurality of separate relays 5 (current flowing through the conductive path 11) will increase during this time period. However, the coils 30 respectively provided in the parallel conductive paths 12 suppress an instantaneous and sudden increase in the current flowing through the parallel conductive paths 12, and thus the current I flowing through the plurality of separate relays 5 (current flowing through the conductive path 11) increases gradually. Also, the voltage of the second power storage unit 92 (sub battery) decreases gradually instead of suddenly during the time period from the occurrence of the earth fault up until to the off operation of all of the switch units 20 is complete. Accordingly, it is possible to suppress a sudden decrease in the voltage of the second power storage unit 92 (sub battery) immediately after the occurrence of an earth fault, and to avoid such a situation in which the voltage of the second power storage unit 92 (sub battery) is drastically reduced before all of the switch units 20 are switched off. Moreover, since the time interval between the occurrence of the earth fault and the completion of switching of all of the switch units 20 can be reduced, it is possible to further suppress a decrease in the voltage of the second power storage unit 92 immediately after the occurrence of the earth fault.

As described above, in the relay device 1 of the present configuration, if an earth fault or the like has occurred in a current flow path (conductive path 11) between the first power storage unit 91 and the second power storage unit 92, or a portion electrically connected to this conductive path 11, and the voltage in the conductive path 11 is abnormal, protection can be achieved by switching off the switch units 20. Furthermore, each coil 30 (inductance unit) is connected in series to the switch unit 20, and thus, when a current flows from any of the power storage units toward the portion at which the earth fault has occurred via the coil 30 and the switch unit 20, the rate of increase in the current can be suppressed. Accordingly, a decrease in the voltage of the corresponding power storage unit can be suppressed up until the off operation (protection operation) on the conductive path 11 performed by the switch unit 20 is complete, so that a problem caused by a decrease in the output of that power storage unit is unlikely to occur.

Moreover, the voltage detection units (the first voltage detection unit 61 and the second voltage detection unit 62) are respectively provided at positions, in the path, on the first power storage unit 91 side and the second power storage unit 92 side with respect to the coils 30 (inductance units), and thus, if an earth fault or the like has occurred in the conductive path 11 or a portion electrically connected to the conductive path 11, the value detected by any one of the voltage detection units immediately changes to an abnormal value due to the occurrence of the earth fault or the like. For example, if an earth fault or the like has occurred, on the first power storage unit 91 side, of the conductive path 11 or a portion electrically connected to the conductive path 11, the voltage on the first power storage unit 91 side of the conductive path 11 instantaneously decreases, and thus the value detected by the first voltage detection unit 61 instantaneously changes to an abnormal value. Similarly, if an earth fault or the like has occurred, on the second power storage unit 92 side, of the conductive path 11 or a portion electrically connected to the conductive path 11, the voltage on the second power storage unit 92 side of the conductive path 11 instantaneously decreases, and thus the value detected by the second voltage detection unit 62 instantaneously changes to an abnormal value. Accordingly, the control unit 3 can promptly recognize the abnormal state (state in which the detected voltage value has changed to an abnormal value) in the event of an earth fault, and can switch the switch units 20 to the OFF state at an earlier stage.

In this way, if an earth fault or the like has occurred, a sudden increase in current can be suppressed by the coils 30 (inductance units), and the switch units 20 can promptly undergo off operation by the control unit 3, making it possible to suppress a current that flows through the conductive path 11 during the time period from the occurrence of the earth fault up until the switch units 20 are switched to the OFF state to a smaller current, and suppress a reduction in the voltage of the power storage unit provided on the side opposite to that on which the earth fault or the like occurred to a smaller voltage.

Furthermore, the switch units 20 provided on the parallel conductive paths 12 constituting the conductive path 11 each include a MOSFET 21 and a MOSFET 22. The MOSFET 21 is provided with the first element unit 21A that is switched between an ON state and an OFF state, and a body diode 21B (first diode unit) connected in parallel to the first element unit 21A. The MOSFET 22 is provided with the second element unit 22A that is switched between an ON state and an OFF state, and a body diode 22B (second diode unit) that is connected in parallel to the second element unit 22A and is arranged inversely with respect to the body diode 21B (first diode unit). According to this configuration, it is possible to interrupt a bi-directional current flow on the conductive path 11. If an earth fault or the like has occurred at a position, on the second power storage unit 92 side, of the conductive path 11, the rate of increase in the discharge current that is to flow from the first power storage unit 91 toward the position at which the earth fault occurred is diminished by the coils 30 (inductance units), and thus a sudden decrease in the voltage of the first power storage unit 91 is suppressed. In this case, a decrease in the voltage of the first power storage unit 91 can be suppressed up until the off operation (protection operation) on the conductive path 11 performed by the switch units 20 is complete, so that a problem (such as ECU reset) caused by a decrease in the output of the first power storage unit 91 is unlikely to occur. Alternatively, if an earth fault or the like has occurred at a position, on the first power storage unit 91 side, of the conductive path 11, the rate of increase in the discharge current that is to flow from the second power storage unit 92 toward the position at which the earth fault occurred is diminished by the coils 30 (inductance units), and thus a sudden decrease in the voltage of the second power storage unit 92 can be suppressed. In this case, a decrease in the voltage of the second power storage unit 92 can be suppressed up until the off operation (protection operation) on the conductive path 11 performed by the switch units 20 is complete, so that a problem caused by a decrease in the output of the second power storage unit 92 is unlikely to occur.

The relay device 1 includes the protective circuit units 40 that suppress a back electromotive force that is generated in the coils 30 (inductance units) when the switch units 20 are switched off. Specifically, the protective circuit units 40 have a function of suppressing a back electromotive force that is generated in the coils 30 (inductance units) when the switch units 20 are switched off in a state in which a current is flowing through the conductive path 11 in the first direction from any one of the first power storage unit 91 and the second power storage unit 92 to the other one. Furthermore, the protective circuit units 40 also have a function of suppressing a back electromotive force that is generated in the coils 30 (inductance units) when the switch units 20 are switched off in a state in which a current is flowing through the conductive path 11 in the second direction, which is the reverse direction of the first direction.

According to this configuration, it is possible to realize a configuration that diminishes, using the coils 30 (inductance units), the rate of increase in the discharge current that flows from the power storage unit in the event of an earth fault or the like, while suppressing, using the protective circuit units 40, a back electromotive force that is generated in the coils 30 (inductance units) when the switch units 20 are switched off. Accordingly, it is possible to avoid problems (such as breakage of the switch units 20) caused by the back electromotive force. Specifically, it is possible to interrupt a current flowing through the conductive path 11 in either of the first direction or the second direction, and to suppress a back electromotive force that is generated when a current flowing in either direction is interrupted, making it possible to more reliably avoid problems (such as breakage of the switch units 20) caused by the back electromotive force.

In the relay device 1, the plurality of series configuration units 42, in each of which the switch unit 20 and the coil 30 (inductance unit) are connected in series to each other, are connected in parallel to each other between the first power storage unit 91 and the second power storage unit 92. According to this configuration, it is possible to realize a configuration in which a higher current can flow between the first power storage unit 91 and the second power storage unit 92, with downsized switch units 20 and downsized coils 30 (inductance units).

Other Embodiments

The present disclosure is not limited to the embodiment described with reference to the description above and the drawings, and the technical scope of the present disclosure encompasses, for example, the following embodiments.

Although, in the above-described Embodiment 1, actuators (for example, motorized power steering systems) that require redundancy are exemplified as the main load 81 and the sub load 82, they may be other components. For example, the main load 81 may be configured as a sensing device such as a radar, ultrasonic sensor or a camera, and the sub load 82 may be configured as a backup sensing device that has the same function as this. Furthermore, the load connected to the first power storage unit 91 side, and the load connected to the second power storage unit 92 side may have different functions.

Although the above-described Embodiment 1 shows an example in which the number of the separate relays 5 is three, one separate relay 5 or three or more separate relays 5 may be provided.

Although the above-described Embodiment 1 shows an example in which the switch unit 20 arranged in each separate relay 5 is made of two MOSFETs 21 and 22, the switch unit 20 may be made of semiconductor switches other than MOSFETs. Furthermore, the configuration of the separate relay 5 is not limited to a configuration in which two semiconductor switches are arranged in series to the coil 30, and a configuration is also possible in which one semiconductor switch element is connected in series to the coil 30, or three or more semiconductor switch elements are connected in series to the coil 30. Moreover, the switch units 20 may be mechanical relays.

The invention claimed is:
1. A relay device comprising:
  a conductive path between a first wiring electrically connected to a first load and a first power storage unit, and a second wiring electrically connected to a second load and a second power storage unit, the conductive path serving as a path through which a current flows;
  a switch unit that is connected to the conductive path between the first wiring and the second wiring, and is configured to be switched between an ON state in which a current can flow through the conductive path, and an OFF state in which the conductive path is in a predetermined no current flow state;

an inductance unit that is connected in series to the switch unit between the first wiring and the second wiring, and has an inductance component;

a first voltage detection unit configured to detect a voltage of the conductive path at a position on the first power storage unit side with respect to the inductance unit;

a second voltage detection unit configured to detect a voltage of the conductive path at a position on the second power storage unit side with respect to the inductance unit; and a control unit configured to switch the switch unit to the OFF state if a value detected by at least one of the first voltage detection unit and the second voltage detection unit has decreased to a predetermined abnormal value.

2. The relay device according to claim 1, wherein the switch unit includes: a first semiconductor switch provided with a first element unit that is switched between an ON state and an OFF state, and a first diode unit connected in parallel to the first element unit; and a second semiconductor switch provided with a second element unit that is switched between an ON state and an OFF state, and a second diode unit that is connected in parallel to the second element unit and is arranged inversely with respect to the first diode unit.

3. The relay device according to claim 2, further comprising, a protective circuit unit configured to suppress a back electromotive force that is generated in the inductance unit when the switch unit is switched off in a state in which a current is flowing through the conductive path in a first direction from any one of the first power storage unit and the second power storage unit to the other one, and to suppress a back electromotive force that is generated in the inductance unit when the switch unit is switched off in a state in which a current is flowing through the conductive path in a second direction, which is the reverse direction of the first direction.

4. The relay device according to claim 2, wherein a plurality of series configuration units, in each of which the switch unit and the inductance unit are connected in series to each other, are connected in parallel to each other between the first power storage unit and the second power storage unit.

5. The relay device according to claim 1, further comprising, a protective circuit unit configured to suppress a back electromotive force that is generated in the inductance unit when the switch unit is switched off in a state in which a current is flowing through the conductive path in a first direction from any one of the first power storage unit and the second power storage unit to the other one, and to suppress a back electromotive force that is generated in the inductance unit when the switch unit is switched off in a state in which a current is flowing through the conductive path in a second direction, which is the reverse direction of the first direction.

6. The relay device according to claim 5, wherein a plurality of series configuration units, in each of which the switch unit and the inductance unit are connected in series to each other, are connected in parallel to each other between the first power storage unit and the second power storage unit.

7. The relay device according to claim 1, wherein a plurality of series configuration units, in each of which the switch unit and the inductance unit are connected in series to each other, are connected in parallel to each other between the first power storage unit and the second power storage unit.

\* \* \* \* \*